US011585839B2

(12) United States Patent
Takahashi

(10) Patent No.: US 11,585,839 B2
(45) Date of Patent: Feb. 21, 2023

(54) RESISTANCE MEASURING DEVICE AND RESISTANCE MEASURING JIG

(71) Applicant: NIDEC READ CORPORATION, Kyoto (JP)

(72) Inventor: Tadashi Takahashi, Kyoto (JP)

(73) Assignee: NIDEC READ CORPORATION, Muko (JP)

( * ) Notice: Subject to any disclaimer, the term of this patent is extended or adjusted under 35 U.S.C. 154(b) by 91 days.

(21) Appl. No.: 17/040,555

(22) PCT Filed: Mar. 4, 2019

(86) PCT No.: PCT/JP2019/008356
§ 371 (c)(1),
(2) Date: Sep. 23, 2020

(87) PCT Pub. No.: WO2019/181458
PCT Pub. Date: Sep. 26, 2019

(65) Prior Publication Data
US 2021/0063454 A1 Mar. 4, 2021

(30) Foreign Application Priority Data
Mar. 23, 2018 (JP) .............................. JP2018-056107

(51) Int. Cl.
*G01R 27/14* (2006.01)
*G01R 15/00* (2006.01)

(52) U.S. Cl.
CPC ............. *G01R 27/14* (2013.01); *G01R 15/00* (2013.01)

(58) Field of Classification Search
CPC ...... G01R 27/14; G01R 27/025; G01R 15/00; G01R 27/205; G01R 31/3865; G01R 27/08; G01R 1/0416; G01R 3/00; G01R 27/02
See application file for complete search history.

(56) References Cited

U.S. PATENT DOCUMENTS

| 4,565,966 A | 1/1986 | Burr et al. |
| 2001/0051453 A1 | 12/2001 | Tachi |

(Continued)

FOREIGN PATENT DOCUMENTS

| JP | H10170582 A | 6/1998 |
| JP | 2010014479 A | 1/2010 |
| JP | 2012117991 A | 6/2012 |

(Continued)

*Primary Examiner* — Son T Le
(74) *Attorney, Agent, or Firm* — Viering, Jentschura & Partner MBB

(57) ABSTRACT

A resistance measuring device includes: a first jig; a plurality of first contacts; a second jig; a plurality of second contacts; a resistance measuring unit that supplies a current between a first contact and a second contact, which correspond to each other, detects a voltage between a first contact and a second contact, and calculates a resistance value of an object to be measured based on a relationship between a value of the supplied current and a value of the detected voltage; first wirings connecting the resistance measuring unit and each of the first contacts, for the first contacts, respectively; and second wirings connecting the resistance measuring unit and each of the second contacts while passing from the resistance measuring unit through the first jig, for the second contacts, respectively.

10 Claims, 6 Drawing Sheets

(56) References Cited

U.S. PATENT DOCUMENTS

2004/0012383 A1* 1/2004 Kimura ............. G01R 1/07371
324/763.01
2008/0146894 A1 6/2008 Bulkes et al.

FOREIGN PATENT DOCUMENTS

JP 2013257259 A 12/2013
WO 2006057407 A1 6/2006

* cited by examiner

RESISTANCE MEASURING DEVICE AND RESISTANCE MEASURING JIG

CROSS-REFERENCE TO RELATED APPLICATIONS

This is the U.S. national stage of application No. PCT/JP2019/008356, filed on Mar. 4, 2019, and priority under 35 U.S.C. § 119(a) and 35 U.S.C. § 365(b) is claimed from Japanese Application No. 2018-056107, filed on Mar. 23, 2018; the disclosures of which are incorporated herein by reference.

FIELD

Various embodiments relate to a resistance measuring device and a resistance measuring jig, and more particularly to a technique for improving measurement accuracy of a resistance measuring device.

BACKGROUND

Conventionally, there is known a resistance measuring device that brings a plurality of contacts into contact with one surface and the other surface of an object to be measured, supplies a current between contacts corresponding to each other to detect a voltage between the contacts, and calculates a resistance value of the object to be measured based on a relationship between a value of the supplied current and a value of the detected voltage. According to the conventional technique, wirings respectively connected to the corresponding contacts are arranged separately.

When the wirings respectively connected to the corresponding contacts are separately arranged as in the background art described above, the degree of electromagnetic influence from the outside differs for each wiring. For this reason, when noise is generated due to an external factor, the magnitude of the noise differs for each wiring, which becomes a factor that decreases measurement accuracy.

SUMMARY

A resistance measuring device according to an example of the present disclosure includes: a first jig that is capable of facing a first surface of an object to be measured; a plurality of first contacts that are provided in the first jig and are capable of being brought into contact with the first surface; a second jig that is capable of facing a second surface of the object to be measured; a plurality of second contacts that are provided in the second jig to correspond to the plurality of first contacts, respectively, and are capable of being brought into contact with the second surface; a resistance measuring unit configured to supply a current between one of the first contacts and one of the second contacts, which correspond to each other, to detect a voltage between another first contact adjacent to the one first contact and another second contact adjacent to the one second contact, which correspond to each other, and to calculate a resistance value of the object to be measured based on a relationship between a value of the supplied current and a value of the detected voltage; first wirings connecting the resistance measuring unit and the first contacts, for the first contacts, respectively; and second wirings connecting the resistance measuring unit and the second contacts while passing from the resistance measuring unit through a vicinity of the first jig, for the second contacts, respectively, the first wirings and the second wirings, respectively connected to the first contacts and the second contacts corresponding to each other, being arranged adjacent to each other between the resistance measuring unit and the first jig.

Further, a resistance measuring device according to an example of the present disclosure includes: a first jig that is capable of facing a first surface of an object to be measured; a plurality of first contacts that are provided in the first jig and are capable of being brought into contact with the first surface; a second jig that is capable of facing a second surface of the object to be measured; a plurality of second contacts that are provided in the second jig to correspond to the plurality of first contacts, respectively, and are capable of being brought into contact with the second surface; a resistance measuring unit configured to supply a current between one of the first contacts and one of the second contacts, which correspond to each other, detects a voltage between another first contact adjacent to the one first contact and another second contact adjacent to the one second contact, which correspond to each other, and calculates a resistance value of the object to be measured based on a relationship between a value of the supplied current value and a value of the detected voltage; first wirings connecting the resistance measuring unit and the first contacts, for the first contacts, respectively; second wirings connecting the resistance measuring unit and the second contacts, for the second contacts, respectively, the first wirings and the second wirings, respectively connected to the first contacts and the second contacts corresponding to each other, being arranged adjacent to each other from the resistance measuring unit to a predetermined point before reaching the first jig; third wirings extended respectively from the predetermined point of the first wirings, for the first contacts, respectively, the third wirings and the second wirings, respectively connected to the first contacts and the second contacts corresponding to each other, being arranged adjacent to each other on a distal side of the predetermined point; and fourth wirings extended respectively from the predetermined point of the second wirings, for the second contacts, respectively, the first wirings and the fourth wirings, respectively connected to the first contacts and the second contacts corresponding to each other, being arranged adjacent to each other on a distal side of the predetermined point.

Further, a resistance measuring jig according to an example of the present disclosure includes: a first jig that is capable of facing a first surface of an object to be measured; a plurality of first contacts that are provided in the first jig and are capable of being brought into contact with the first surface; a second jig that is capable of facing a second surface of the object to be measured; a plurality of second contacts that are provided in the second jig to correspond to the plurality of first contacts, respectively, and are capable of being brought into contact with the second surface; first wirings respectively connected to the first contacts; and second wirings respectively connected to the second contacts and passing through a vicinity of the first jig, the first wirings and the second wirings, respectively connected to the first contacts and the second contacts corresponding to each other, being arranged adjacent to each other on a proximal side of the vicinity of the first jig.

Further, a resistance measuring jig according to an example of the present disclosure includes: a first jig that is capable of facing a first surface of an object to be measured; a plurality of first contacts that are provided in the first jig and are capable of being brought into contact with the first surface; a second jig that is capable of facing a second surface of the object to be measured; a plurality of second contacts that are provided in the second jig to correspond to the plurality of first contacts, respectively, and are capable of being brought into contact with the second surface; first wirings respectively connected to the first contacts; and second wirings respectively connected to the second contacts and passing through the first jig, the first wirings and the second wirings, respectively connected to the first contacts and the second contacts corresponding to each other, being arranged adjacent to each other on a proximal side of a vicinity of the first jig, the first jig including a first connection member connecting the plurality of first contacts and the first wirings, the first connection member including: a plurality of electrodes with which the plurality of first contacts are brought into contact; a first wiring pattern connected to the electrode and connected to the first wirings; and a second partial pattern forming a part of the second wirings, the first wiring pattern and the second partial pattern, respectively connected to the first contacts and the second contacts corresponding to each other, being arranged adjacent to each other in the first connection member.

The above and other elements, features, steps, characteristics and advantages of the present disclosure will become more apparent from the following detailed description of the preferred embodiments with reference to the attached drawings.

DETAILED DESCRIPTION

Figure 1:
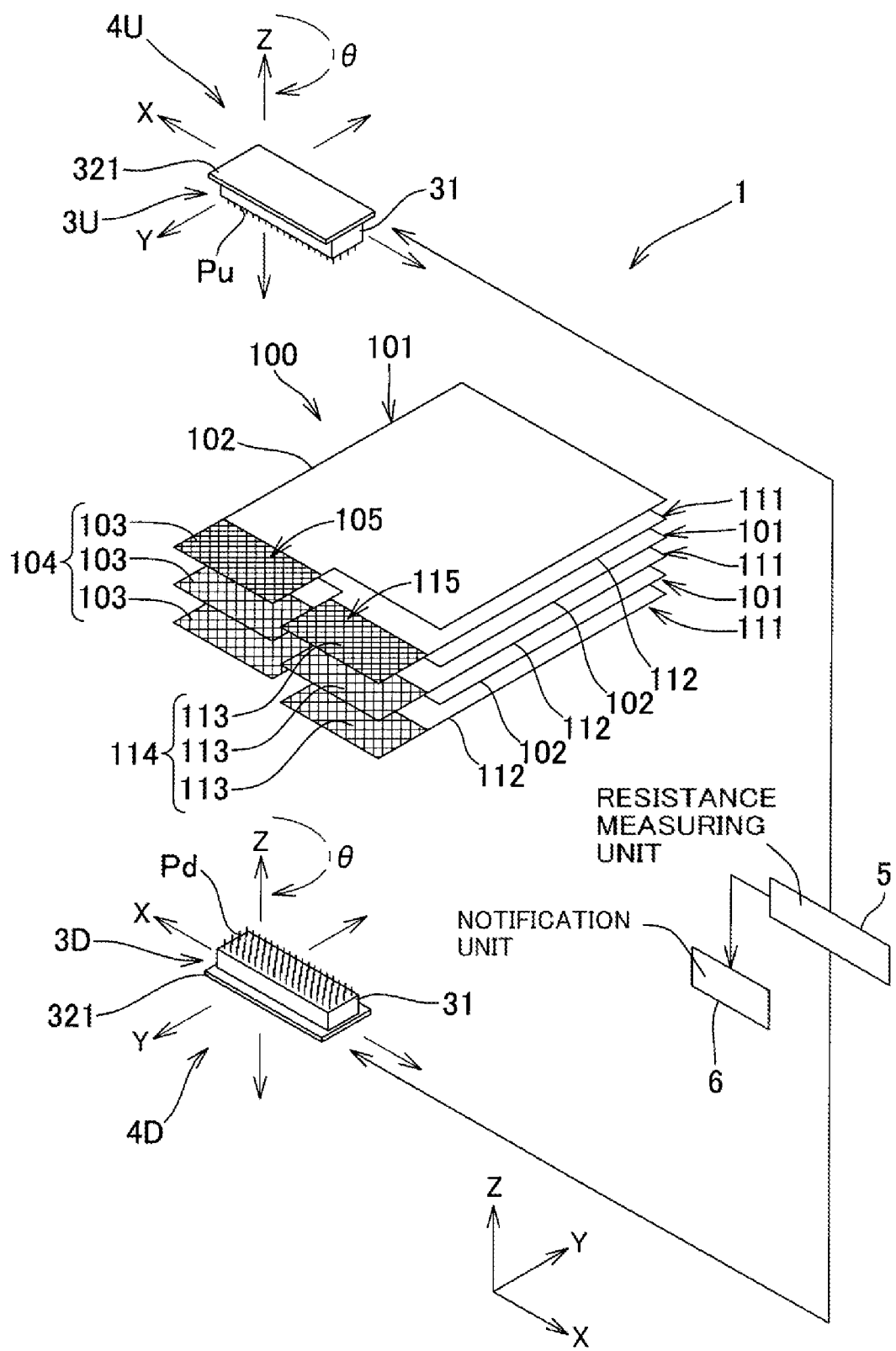
FIG. 1 is a conceptual diagram schematically illustrating a configuration of a resistance measuring device according to a first embodiment.

Hereinafter, a configuration of a resistance measuring device 1 according to a first embodiment of the present disclosure will be described with reference to FIGS. 1 to 4. Note that like parts are designated by like reference characters in the accompanying drawings, and redundant description will be omitted. FIG. 1 is a conceptual diagram schematically illustrating the configuration of the resistance measuring device 1 according to the first embodiment of the present disclosure. The resistance measuring device 1 illustrated in FIG. 1 is a device that measures resistance values of tab terminals 104 and 114 of a lithium ion secondary battery 100 which is an example of an object to be measured. The "lithium ion secondary battery" in the present embodiment includes a work-in-process product before combining a laminate of a positive electrode, a separator, and a negative electrode with an electrolyte. Note that the object to be measured whose resistance value is measured by the resistance measuring device 1 according to the present embodiment is not limited, and other various conductors can be employed as the object to be measured.

A lithium ion secondary battery 100 illustrated in FIG. 1 is configured such that a plurality of positive electrode plates 101 (electrode plates) and a plurality of negative electrode plates 111 (electrode plates) are alternately laminated with a separator (not illustrated) interposed therebetween. The positive electrode plates 101 are configured by coating a positive electrode active material (not illustrated) on surfaces of positive electrode current collectors 102 made of a metal foil, for example, an aluminum foil or the like. The negative electrode plates 111 are configured by coating a negative electrode active material (not illustrated) on surfaces of negative electrode current collectors 112 made of a metal foil, for example, a copper foil or the like.

On one end side of the lithium ion secondary battery 100, a part of each of the positive electrode current collectors 102 is led out as a tab portion 103 (a sheet or a part of an electrode plate), and a part of each of the negative electrode current collectors 112 is led out as a tab portion 113 (a sheet or a part of an electrode plate). Each of the tab portions 103 is led out to one side of the one end, and each of the tab portions 113 is led out toward the side opposite to the tab portion 103. As a result, the tab portion 103 and the tab portion 113 are prevented from overlapping each other.

The respective tab portions 103 are laminated and closely attached to each other, and are welded to each other in a welding area 105 indicated by a band-shaped mesh, thereby serving as a tab terminal 104 of a positive electrode. The respective tab portions 113 are laminated and attached to each other, and are welded to each other in a welding area 115 indicated by a band-shaped mesh, thereby serving as a tab terminal 114 (a sheet member or a tab terminal) of a negative electrode. Although various welding methods can be applied as a welding method of the welding area 105 or 115, ultrasonic welding is used, for example. FIG. 1 illustrates a state before the respective tab portions 103 and 113 are welded.

The resistance measuring device 1 illustrated in FIG. 1 includes: a detection units 4U and 4D, a resistance measuring unit 5, a notification unit 6; and a battery holding unit (not illustrated) that holds the lithium ion secondary battery 100 to be inspected at a predetermined position between the detection units 4U and 4D. The detection units 4U and 4D respectively include first and second jigs 3U and 3D which are detection jigs. The detection units 4U and 4D are configured such that the first and second jigs 3U and 3D can be moved in a Z-axis direction (direction substantially perpendicular to the main surfaces of the tab terminals 104 and 114) by a drive mechanism (not illustrated). The detection units 4U and 4D may be movable in three axial directions of X, Y, and Z, which are orthogonal to each other, and further, may be configured such that the first and second jigs 3U and 3D are rotatable about the Z axis.

The notification unit 6 is a notification device that visually notifies a user of information obtained by the resistance measuring unit 5. As the notification unit 6, for example, a display device as a liquid crystal display device or a printer can be used.

The detection unit 4U is located above the lithium ion secondary battery 100 fixed to the battery holding unit (not illustrated). The detection unit 4U is configured such that the first jig 3U, which is a detection jig configured to sequentially bring a probe Pu into contact with the tab terminals 104 and 114 of the lithium ion secondary battery 100, is detachably attached. The first jig 3U is provided so as to face surfaces on the upper side (the positive Z-axis direction side, the same applies hereinafter) of the tab terminals 104 and 114.

The detection unit 4D is located below the lithium ion secondary battery 100 fixed to the battery holding unit (not illustrated). The detection unit 4D is configured such that the second jig 3D, which is a detection jig configured to sequentially bring a probe Pd into contact with the tab terminals 104 and 114 of the lithium ion secondary battery 100, is detachably attached. The second jig 3D is provided so as to face surfaces on the lower side (the negative Z-axis direction side, the same applies hereinafter) of the tab terminals 104 and 114. The first and second jigs 3U and 3D are configured in the same manner as each other, except that attaching directions to the detection units 4U and 4D are vertically inverted.

Note that the first and second jigs 3U and 3D may be configured such that the probes Pu and Pd are brought into contact with the two tab terminals 104 and 114 at the same time collectively for the tab terminals 104 and 114. In the present embodiment, the probe attached to the first jig 3U located above is referred to as the probe Pu, and the probe attached to the second jig 3D located below is referred to as the probe Pd. Hereinafter, the detection units 4U and 4D are collectively referred to as a detection unit 4, and the probes Pu and Pd are collectively referred to as a probe P.

The first and second jigs 3U and 3D include: support members 31 respectively holding distal ends of the plurality of probes Pu and Pd toward the welding areas 105 and 115 of the tab terminals 104 and 114; and base plates 321, respectively. The base plate 321 is provided with electrodes (not illustrated) that are brought into contact with, and electrical connection with, a rear end portion of each of the probes Pu and Pd. The detection units 4U and 4D electrically connect the respective probes Pu and Pd to a power supply circuit 51 and a voltage circuit 52 of the resistance measuring unit 5 via the respective electrodes of the base plate 321 and a connection circuit 41 to be described below, and switch the connection.

The probes Pu and Pd have a substantially rod-like shape as a whole. The support member 31 includes a plurality of through holes each of which is configured to support each of the probes Pu and Pd. The support member 31 has a shape and a size corresponding to the welding areas 105 and 115. The support member 31 supports the probes Pu and Pd such that the plurality of probes Pu and Pd are brought into contact with the welding area 105 or substantially the entire area of the welding area 115 in a substantially even distribution. For example, the probes Pu and Pd are disposed at positions corresponding to points of intersection on a grid.

Figure 2:
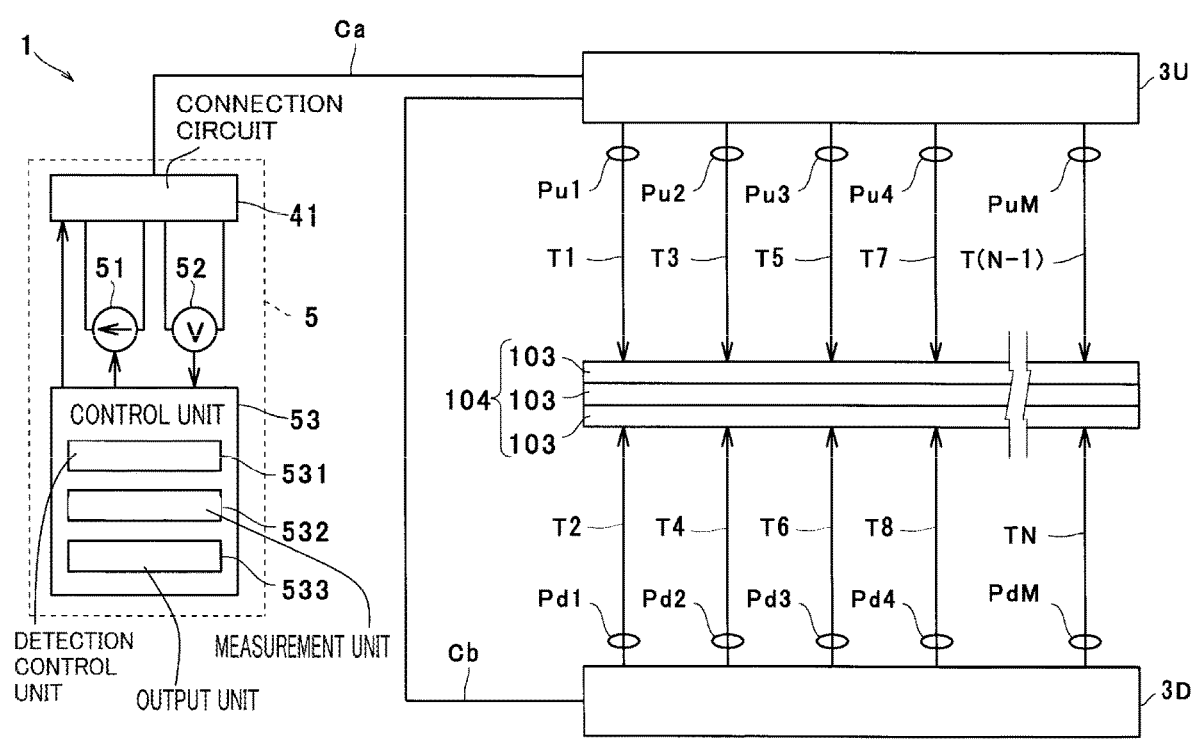
FIG. 2 is a block diagram schematically illustrating an electrical configuration of the resistance measuring device.

FIG. 2 is a block diagram conceptually illustrating an electrical configuration of the resistance measuring device 1 illustrated in FIG. 1. The resistance measuring device 1 illustrated in FIG. 2 includes: M probes Pu1 to PuM provided in the first jig 3U; M probes Pd1 to PdM provided in the second jig 3D; the resistance measuring unit 5; a proximal wiring band Ca; and a distal wiring band Cb. FIG. 2 illustrates a state where the probes Pu1 to PuM and Pd1 to PdM are brought into contact with the tab terminal 104.

Figure 3:
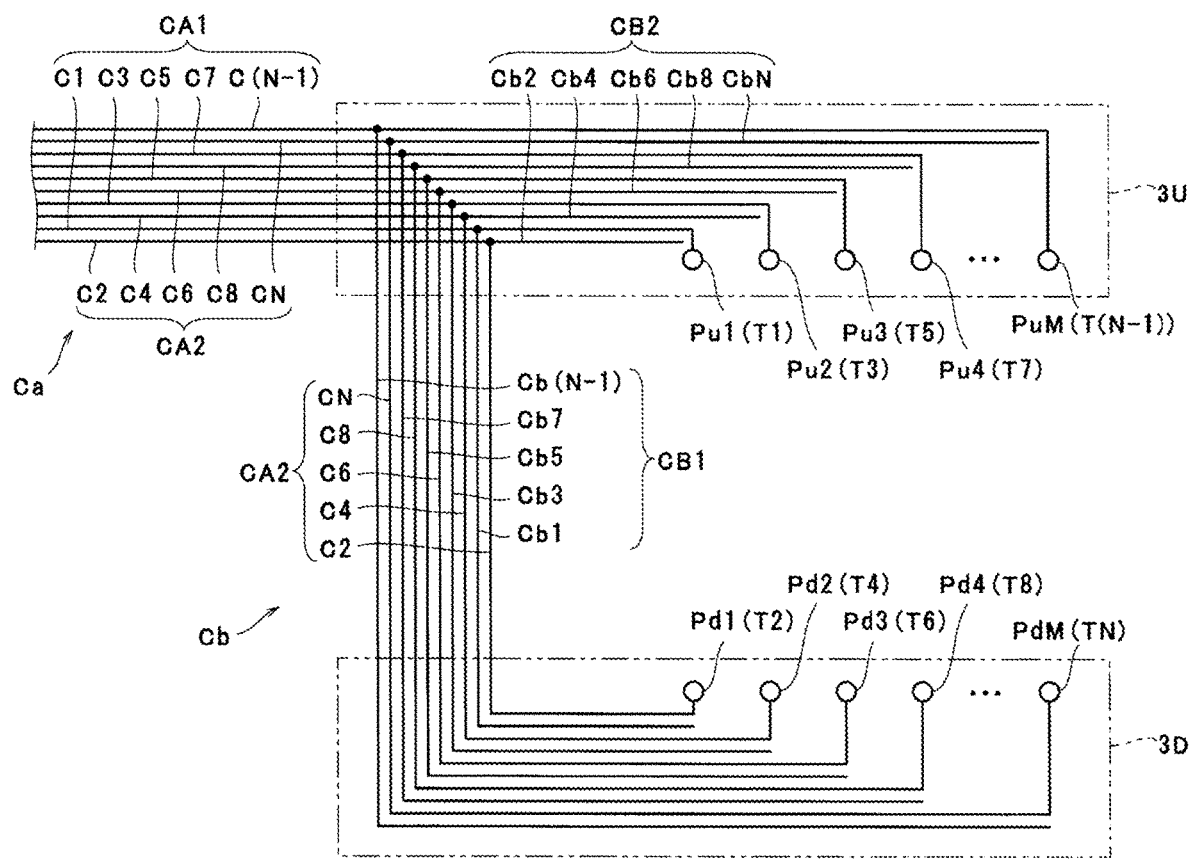
FIG. 3 is a view schematically illustrating an electrical configuration of a resistance measuring jig.

The proximal wiring band Ca is an assembly of wirings that connect the first jig 3U and the connection circuit 41 of the resistance measuring unit 5 (see FIG. 3). The distal wiring band Cb is an assembly of wirings that connect the first jig 3U and the second jig 3D (see FIG. 3). As illustrated in FIG. 2, the resistance measuring unit 5 includes the connection circuit 41, the power supply circuit 51, a voltage detection unit 52, a control unit 53, and the like.

In the present embodiment, configurations of the resistance measuring device 1 except the resistance measuring unit 5 (the first jig 3U, the second jig 3D, the proximal wiring band Ca, and the distal wiring band Cb) are collectively referred to as a "resistance measuring jig". The resistance measuring device 1 is configured such that the resistance measuring jig can be removed and replaced with another resistance measuring jig according to a type of the lithium ion secondary battery 100 to be inspected.

The tab terminal 104 illustrated in FIG. 2 is illustrated in a cross section obtained by cutting the tab terminal 104 illustrated in FIG. 1 along the X-axis direction. The probes Pu1 to PuM and Pd1 to PdM are the probes Pu and Pd, which are arranged in rows, respectively, along the X-axis direction, with each probe number. The probe numbers attached to the probes Pu and Pd correspond to the X-coordinates in the X-axis direction indicating positions of the welding areas 105 with which the respective probes P are brought into contact. That is, the probes Pu and Pd having the same probe number are provided to correspond to each other at the same position.

In addition to the probe P illustrated in FIG. 2, the probes Pu and Pd are provided in a plurality of rows to be adjacent in the Y-axis direction and substantially parallel with each other, but the illustration thereof is omitted. As a number is assigned to each row of the probes P, the numbers of the rows correspond to Y-coordinates in the Y-axis direction indicating positions of the welding area 105 with which the respective probes P are brought into contact. Note that each row of the probes P is not necessarily a straight row, and may be a zigzag, curved, or fluctuating row.

Each of the probes P includes a contact T for a four-terminal measurement method. Specifically, as illustrated in FIG. 2, the probes Pu1, Pu2, Pu3, Pu4, . . . , and PuM provided in the first jig 3U include contacts T1, T3, T5, T7, . . . , and T(N−1) that can be brought into contact with upper surfaces of the tab terminals 104 and 114. Here, N is a number (even number) that is twice of M. Further, the probes Pd1, Pd2, Pd3, Pd4, . . . , and PdM, which are provided in the second jig 3D and correspond to the probes Pu1, Pu2, Pu3, Pu4, . . . , and PuM, respectively, include contacts T2, T4, T6, T8, . . . , and TN that can be brought into contact with lower surfaces of the tab terminals 104 and 114. In the present embodiment, the contacts T1, T3, T5, T7, . . . , and T(N−1) provided in the first jig 3U are collectively referred to as "first contacts". Further, the contacts T2, T4, T6, T8, . . . , and TN provided in the second jig 3D are collectively referred to as "second contacts".

Note that there is no problem even if each probe includes two contacts for current supply and for voltage measurement. It is possible to use a probe having a pair of two needle pins (contacts), for example, as described in JP 2006-329998 A, and a coaxial probe including one contact having a cylindrical shape and another contact inserted inside the one contact, for example, as described in JP 2012-154670 A. Alternatively, each of the rod-shaped probes arranged in a grid pattern may be used as a contact, and the two probes (contacts) may be used as one set as one probe.

The first contacts T1, T3, T5, T7, . . . , and T(N−1) provided in the first jig 3U are connected to the connection circuit 41 of the resistance measuring unit 5 via the proximal wiring band Ca. Specifically, as illustrated in FIG. 3, the proximal wiring band Ca include first wirings C1, C3, C5, C7, . . . , and C(N−1) each connecting each of the first contacts T1, T3, T5, T7, . . . , and T(N−1) and the connection circuit 41. Hereinafter, the first wirings C1, C3, C5, C7, . . . , and C(N−1) are collectively referred to as a "first wiring group CA1".

The second contacts T2, T4, T6, T8, . . . , and TN provided in the second jig 3D are connected to the connection circuit 41 of the resistance measuring unit 5 via the proximal wiring band Ca and the distal wiring band Cb. Specifically, as illustrated in FIG. 3, the proximal wiring band Ca and the distal wiring band Cb include second wirings C2, C4, C6, C8, . . . , and CN each connecting each of the second contacts T2, T4, T6, T8, . . . , and TN and the connection circuit 41. Hereinafter, the second wirings C2, C4, C6, C8, . . . , and CN are collectively referred to as a "second wiring group CA2".

Further, the first contacts T1, T3, T5, T7, . . . , and T(N−1) provided in the first jig 3U are connected to the second jig 3D via the distal wiring band Cb. Specifically, as illustrated in FIG. 3, the distal wiring band Cb includes third wirings Cb1, Cb3, Cb5, Cb7, . . . , and Cb(N−1) connected to the first contacts T1, T3, T5, . . . , and T(N−1), respectively, and extended to branch from the first wirings C1, C3, C5, C7, . . . , and C(N−1), respectively. Each of the third wirings Cb1, Cb3, Cb5, Cb7, . . . , and Cb(N−1) is not electrically connected in the second jig 3D and is configured as an open end. Hereinafter, the third wirings Cb1, Cb3, Cb5, Cb7, . . . , and Cb(N−1) are collectively referred to as a "third wiring group CB1". Note that there is no problem even if the open end of the third wiring group CB1 is separated from the second jig 3D as long as being in the vicinity of the second jig 3D as illustrated in a second embodiment in FIG. 5.

Further, the second contacts T2, T4, T6, T8, . . . , and TN provided in the second jig 3D are respectively connected to fourth wirings Cb2, Cb4, Cb6, Cb8, . . . , and CbN provided in the first jig 3U on the distal side of a point where the first wiring group CA1 and the second wiring group CA2 are divided as illustrated in FIG. 3. The fourth wirings Cb2, Cb4, Cb6, Cb8, . . . , and CbN are extended to branch respectively from the second wirings C2, C4, C6, C8, . . . , and CN in the first jig 3U. Each of the fourth wirings Cb2, Cb4, Cb6, Cb8, . . . , and CbN is not electrically connected in the first jig 3U and is configured as an open end. Hereinafter, the fourth wirings Cb2, Cb4, Cb6, Cb8, . . . , and CbN are collectively referred to as a "fourth wiring group CB2". Note that there is no problem even if the open end of the fourth wiring group CB2 is separated from the first jig 3U as long as being in the vicinity of the first jig 3U as illustrated in the second embodiment in FIG. 5.

In the present embodiment, the connection circuit 41 is configured using, for example, a plurality of switching elements. The connection circuit 41 selects a pair of probes Pu and Pd (one probe Pu and one probe Pd) corresponding to each other with the tab terminal 104 interposed therebetween in response to a control signal from the control unit 53. Then, a positive electrode of the power supply circuit 51 is connected to the first contact T of the selected one probe Pu, and a negative electrode of the power supply circuit 51 is connected to the second contact T of the one probe Pd corresponding to the one probe Pu. For example, when the probes Pu1 and Pd1 are selected as the one probe Pu and one probe Pd, the first contact T1 and the second contact T2 are connected to the power supply circuit 51.

Further, the connection circuit 41 selects a pair of probes Pu and Pd (other probes Pu and Pd), which correspond to each other with the tab terminal 104 interposed therebetween and are adjacent to the above-described one probe Pu and one probe Pu, in response to a control signal from the control unit 53. Then, a positive electrode of the voltage circuit 52 is connected to the first contact T of the other selected probe Pu, and a negative electrode of the voltage circuit 52 is connected to the second contact T of the probe Pd corresponding to the other probe Pu. For example, when the probes Pu1 and Pd1 are selected as the one probe Pu and one probe Pd, the probes Pu2 and Pd2 can be selected as the other probes Pu and Pd to connect the first contact T3 and the second contact T4 to the voltage circuit 52.

The power supply circuit 51 is, for example, a constant current power supply circuit such as a switching power supply circuit. The power supply circuit 51 supplies a constant DC current I set in advance between the first contacts T1, T3, T5, . . . , or T(N−1) and the second contacts T2, T4, T6, . . . , or TN which correspond to each other (for example, between the contact T1 of the probe Pu1 and the contact T2 of the probe Pd1) in response to a control signal from the control unit 53.

The voltage detection unit 52 is a voltage measurement circuit configured using, for example, a voltage dividing resistor or an analog/digital converter. The voltage detection unit 52 measures a voltage V between the first contacts T1, T3, T5, . . . , or T(N−1) and the second contacts T2, T4, T6, . . . , or TN (for example, between the contact T3 of the probe Pu2 and the contact T4 of the probe Pd2), which correspond to each other, in a pair of the probes Pu and Pd selected by the connection circuit 41, and transmits the measured value to the control unit 53.

The control unit 53 is, for example, a so-called microcomputer which includes: a central processing unit (CPU) that performs predetermined arithmetic processes, a random-access memory (RAM) that temporarily stores data, a storage device that stores a predetermined control program, etc., peripheral circuits therefor, and so on. Then, the control unit 53 functions as a detection control unit 531, a measurement unit 532, and an output unit 533 by executing the above control program, for example.

The detection control unit 531 controls a drive mechanism (not illustrated) to move and position the detection units 4U and 4D, and sequentially brings distal ends of the respective probes Pu and Pd into contact with the welding areas 105 and 115 of the lithium ion secondary battery 100. Note that the first and second jigs 3U and 3D may include the number of the probes Pu and Pd that can be simultaneously brought into contact with the welding areas 105 and 115 to bring the probes Pu and Pd into contact with the welding areas 105 and 115 at the same time. In this case, the resistance measurement by the four-terminal measurement method becomes possible since each of the probes P includes the contact T, and the current supply and the voltage measurement are performed by the different contacts T.

The measurement unit 532 calculates resistance values of the tab terminals 104 and 114 between the probes Pu and Pd corresponding to each other (for example, the probes Pu1 and Pd1) based on a relationship between a current value supplied by the power supply circuit 51 and the voltage value detected by the voltage detection unit 52. The output unit 533 causes the notification unit 6 to output the resistance values calculated by the measurement unit 532.

The connection circuit 41 changes the selected probes Pu and Pd and calculates resistance values sequentially for each of the corresponding probes Pu and Pd. At this time, the probes Pu and Pd that have functioned for current supply in one inspection step are made to function for voltage measurement in the next inspection step. For example, when the contact T1 is electrically connected to the power supply circuit 51 in the connection circuit 41, the contact T1 functions for current supply (in this case, the first wiring C1 functions as a wiring for current supply). On the other hand, when the same contact T1 is electrically connected to the voltage detection unit 52, the contact T1 functions for voltage measurement (in this case, the first wiring C1 functions as a wiring for voltage measurement). According to this configuration, it is possible to obtain the number of measurement points that is substantially equal to the number M of the contacts T provided in the first jig 3U.

Further, not only the combination in which two adjacent contacts T in the same row are made to function for current supply and voltage measurement but also a combination of two adjacent contacts T in adjacent rows can be used. As a result, it is possible to obtain the number of measurement points larger than the number of the contacts T provided in the first jig 3U, and thus, the number of measurement points per unit area of a measured object can be increased. That is, it is possible to easily detect a portion having a high resistance due to a local lack of welding strength in the tab terminals 104 and 114 of the lithium ion secondary battery 100.

In the resistance measuring device 1 according to the present embodiment, and the resistance measuring jig provided in the resistance measuring device 1, the first wiring group CA1 and the second wiring group CA2, respectively connected to the first contacts T1, T3, T5, . . . , or T(N-1) and the second contacts T2, T4, T6, . . . , or TN corresponding to each other, are arranged adjacent to each other in the proximal wiring band Ca connecting the resistance measuring unit 5 and the first jig 3U as illustrated in FIG. 3. Specifically, the first wirings C1, C3, C5, C7, . . . , or C(N-1) connected to each of the first contacts T1, T3, T5, . . . , and T(N-1) and the second wirings C2, C4, C6, C8, . . . , or CN connected to each of the second contacts T2, T4, T6, T8, . . . , and TN are arranged adjacent to each other at corresponding positions.

In this manner, in the resistance measuring device 1 and the resistance measuring jig provided in the resistance measuring device 1 according to the present embodiment, the first wirings and the second wirings (for example, the first wiring C1 and the second wiring C2), respectively connected to the first contacts and second contacts (for example, first contact T1 and second contact T2) corresponding to each other, are arranged adjacent to each other between the resistance measuring unit 5 and the first jig 3U (on the proximal side of the first jig 3U). For this reason, noise caused by electromagnetic influence from the outside is generated in adjacent wirings with substantially the same magnitude.

Figure 4:
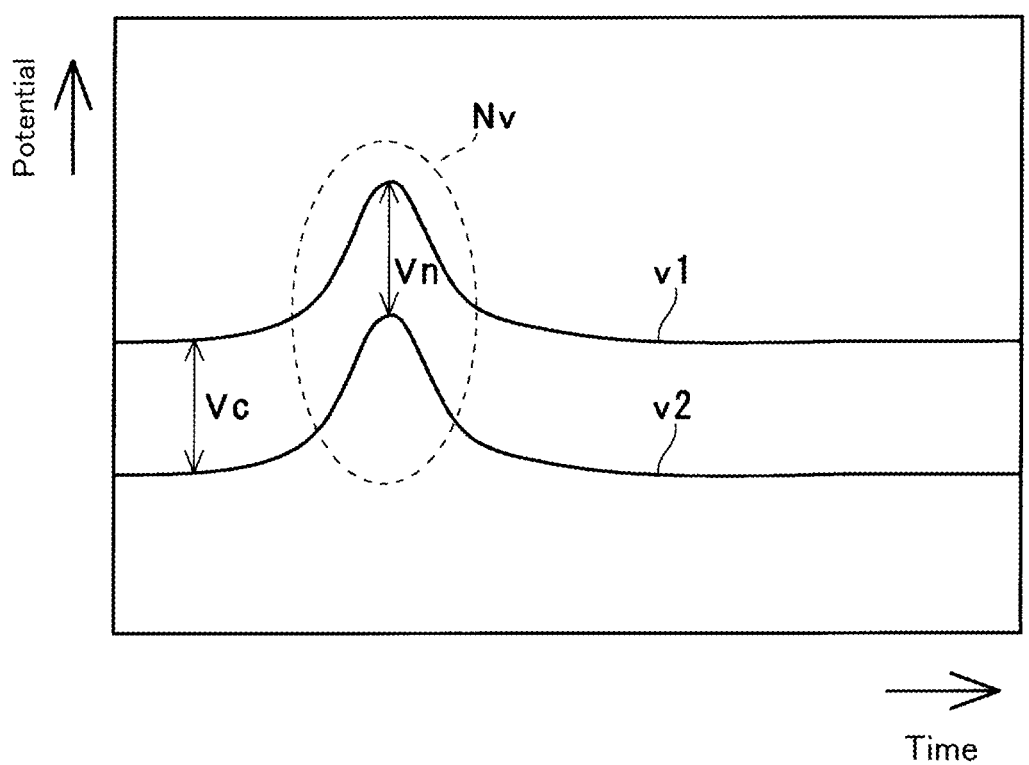
FIG. 4 is a graph illustrating a relationship between a voltage and noise.

Specifically, as illustrated in FIG. 4, assuming that potentials measured by the first contact T1 and the second contact T2 are v1 and v2, changes caused by a noise component Nv appear similarly in both v1 and v2. For this reason, a potential difference Vn does not significantly change from a normal potential difference Vc even when being affected by the noise component Nv. That is, even when noise is generated between the resistance measuring unit 5 and the first jig 3U due to an external factor, it is possible to suppress a decrease in measurement accuracy in the resistance measuring device 1.

As illustrated in FIGS. 2 and 3, the second wiring group CA2 connects the resistance measuring unit 5 and the second contacts T2, T4, T6, T8, . . . , or TN while passing from the resistance measuring unit 5 through the vicinity of the first jig 3U for each of the second contacts T2, T4, T6, T8, . . . , and TN. In the present embodiment, as illustrated in FIG. 3, the second wiring group CA2 is configured to branch from the first wiring group CA1 in the first jig 3U. However, there is no problem even if a point where the second wiring group CA2 branches from the first wiring group CA1 is separated from the first jig 3U as long as being in the vicinity of the first jig 3U. In other words, the "vicinity of the first jig 3U" in the present embodiment is used to mean both the "first jig 3U" and a "point separated in the vicinity of the first jig 3U".

Further, in the resistance measuring device 1 and the resistance measuring jig provided in the resistance measuring device 1 according to the present embodiment, the third wiring group CB1 and the second wiring group CA2, respectively connected to the first contacts T1, T3, T5, . . . , or T(N-1) and the second contacts T2, T4, T6, . . . , or TN corresponding to each other, are arranged adjacent to each other in the distal wiring band Cb connecting the first jig 3U and the second jig 3D as illustrated in FIG. 3. Specifically, the third wirings Cb1, Cb3, Cb5, Cb7, . . . , or Cb(N-1) connected to each of the first contacts T1, T3, T5, . . . , and T(N-1) and the second wirings C2, C4, C6, C8, . . . , or CN connected to each of the second contacts T2, T4, T6, T8, . . . , and TN are arranged adjacent to each other at corresponding positions.

In this manner, in the resistance measuring device 1 and the resistance measuring jig provided in the resistance measuring device 1 according to the present embodiment, the third wirings and the second wirings (for example, the third wiring Cb1 and the second wiring C2), respectively connected to the first contacts and second contacts (for example, first contact T1 and second contact T2) corresponding to each other, are arranged adjacent to each other between the first jig 3U and the second jig 3D. For this reason, noise caused by electromagnetic influence from the outside on the second wirings is generated in adjacent third wirings with substantially the same magnitude. That is, noise generated in the second wirings is similarly generated in the third wirings and is transmitted to the first wirings, so that the influence of noise can be reduced. As a result, even when noise is generated between the first jig 3U and the second jig 3D due to an external factor, it is possible to suppress a decrease in measurement accuracy in the resistance measuring device 1.

Further, in the resistance measuring device 1 and the resistance measuring jig provided in the resistance measuring device 1 according to the present embodiment, the first wiring group CA1 and the fourth wiring group CB2, respectively connected to the first contacts T1, T3, T5, . . . , or T(N-1) and the second contacts T2, T4, T6, . . . , or TN corresponding to each other, are arranged adjacent to each other in the first jig 3U on the distal side of a point where the first wiring group CA1 and the second wiring group CA2 are divided as illustrated in FIG. 3. Specifically, the first wirings C1, C3, C5, C7, . . . , or C(N-1) connected to each of the first contacts T1, T3, T5, . . . , and T(N-1) and the fourth wirings Cb2, Cb4, Cb6, Cb8, . . . , or CbN connected to each of the second contacts T2, T4, T6, T8, . . . , and TN are arranged adjacent to each other at corresponding positions.

In this manner, in the resistance measuring device 1 and the resistance measuring jig provided in the resistance measuring device 1 according to the present embodiment, the first wirings and the fourth wirings (for example, the first wiring C1 and the fourth wiring Cb2), respectively connected to the first contacts and second contacts (for example, first contact T1 and second contact T2) corresponding to each other, are arranged adjacent to each other in the first jig 3U on the distal side of the point where the first wiring group CA1 and the second wiring group CA2 are divided. For this reason, noise caused by electromagnetic influence from the outside on the first wirings is generated in adjacent fourth wirings with substantially the same magnitude. That is, noise generated in the first wirings is similarly generated in the fourth wirings and is transmitted to the second wirings, so that the influence of noise can be reduced. As a result, even when noise is generated due to an external factor on the distal side of the point where the first wiring group CA1 and the second wiring group CA2 are divided, it is possible to suppress a decrease in measurement accuracy in the resistance measuring device 1.

Figure 5:
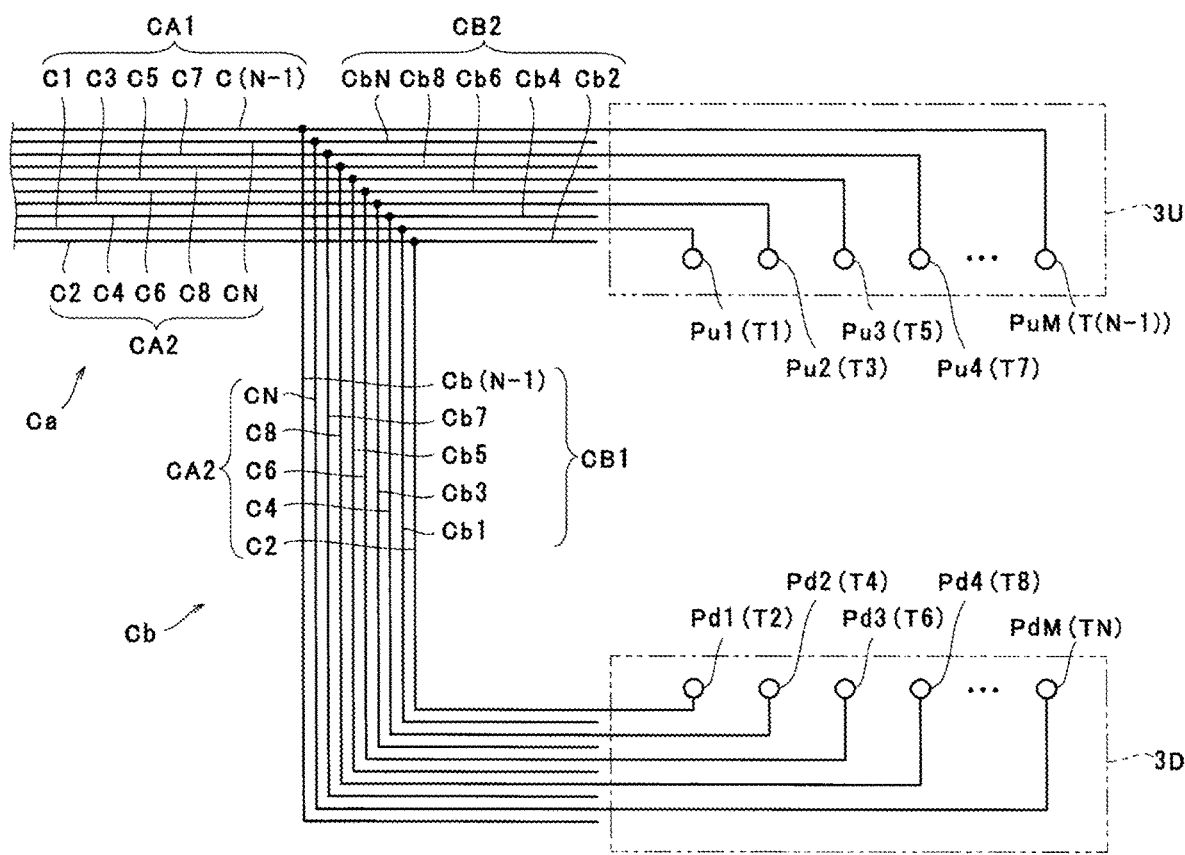
FIG. 5 is a view schematically illustrating an electrical configuration of a resistance measuring jig in a resistance measuring device according to a second embodiment.

Further, the point where the second wiring group CA2 branches from the first wiring group CA1 is not necessarily in the vicinity of the first jig 3U as long as all of the first wiring group CA1, the second wiring group CA2, the third wiring group CB1, and the fourth wiring group CB2 are provided as in the second embodiment illustrated in FIG. 5. That is, in the present embodiment, the first wiring group CA1 and the second wiring group CA2, respectively connected to the first contacts T1, T3, T5, . . . , or T(N−1) and the second contacts T2, T4, T6, T8, . . . , or TN corresponding to each other, are arranged adjacent to each other up to a predetermined point separated from the first jig 3U (point where the second wiring group CA2 branches from the first wiring group CA1 in FIG. 5) between the resistance measuring unit 5 (see FIG. 2) and the first jig 3U. Then, the third wiring group CB1 and the second wiring group CA2, respectively connected to the first contacts T1, T3, T5, . . . , and T(N−1) and the second contacts T2, T4, T6, T8, . . . , and TN corresponding to each other, are arranged adjacent to each other on the distal side of the predetermined point. Furthermore, the first wiring group CA1 and the fourth wiring group CB2, respectively connected to the first contacts T1, T3, T5, . . . , and T(N−1) and the second contacts T2, T4, T6, T8, . . . , and TN corresponding to each other, are arranged adjacent to each other on the distal side from the predetermined point.

According to this configuration, the first wirings and the second wirings are arranged adjacent to each other up to the predetermined point, and the third wirings and the second wirings are arranged adjacent to each other and the first wirings and the fourth wirings are arranged adjacent to each other on the distal side of the predetermined point. Thus, noise is generated in adjacent wirings with substantially the same magnitude even when the noise is generated in each wiring due to an external factor. That is, the noise generated in one wiring is also generated in the adjacent wiring and transmitted, so that the influence of noise can be reduced. As a result, even when noise is generated in any wiring due to an external factor, it is possible to suppress a decrease in measurement accuracy in the resistance measuring device 1.

Note that the open end of the third wiring group CB1 may reach the second jig 3D in this configuration. For example, if a second wiring pattern and a third wiring pattern having an open end are arranged adjacent to each other, a part of the second wiring group CA2 on the distal side is configured as the second wiring pattern, and a part of the third wiring group CB1 on the distal side is configured as the third wiring pattern in a printed circuit board (PCB) interposer such as a second connection member to be described below, it is possible to suppress a decrease in measurement accuracy in the resistance measuring device 1 even when noise is generated in the second jig 3D due to an external factor. Further, the open end of the fourth wiring group CB2 may reach the first jig 3U, and adjacent wiring patterns may be configured as a part on the distal side of each of the first wiring group CA1 and the fourth wiring group CB2 similarly to the PCB interposer.

Figure 6:
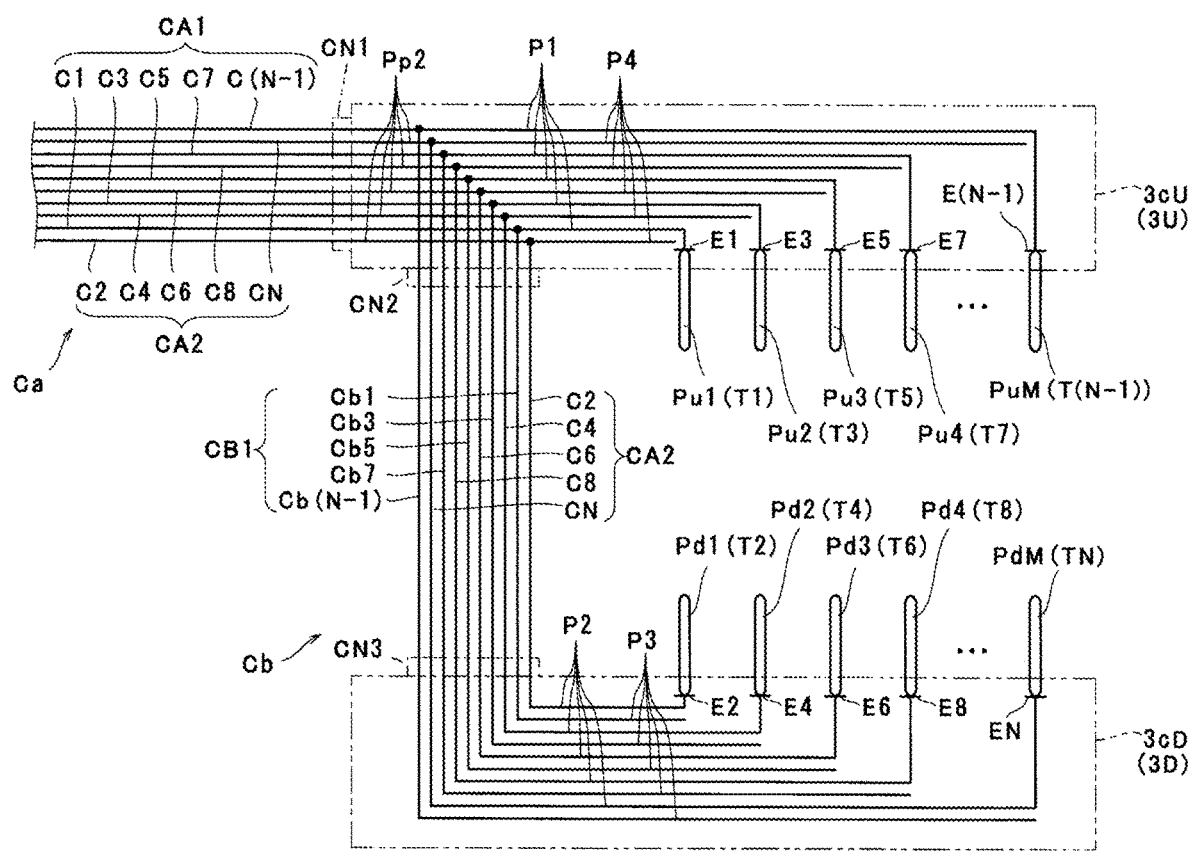
FIG. 6 is a view schematically illustrating an electrical configuration of a resistance measuring jig in a resistance measuring device according to a third embodiment.

Next, an electrical configuration of a resistance measuring jig in a resistance measuring device according to a third embodiment of the present disclosure will be described with reference to FIG. 6. The resistance measuring jig according to the present embodiment is different from the configuration of the resistance measuring jig according to the first embodiment in terms that the first jig 3U includes a first connection member 3cU and the second jig 3D includes a second connection member 3cD as illustrated in FIG. 6. In the present embodiment, the same components as those in the first embodiment are denoted by the same reference signs, and the detailed description thereof will be omitted. Note that it is also possible to adopt a configuration in which only the first jig 3U includes the first connection member 3cU and the second jig 3D does not include the second connection member 3cD. Conversely, it is also possible to adopt a configuration in which only the second jig 3D includes the second connection member 3cD and the first jig 3U does not include the first connection member 3cU.

The first connection member 3cU and the second connection member 3cD are configured using PCB interposers, and various wiring patterns (first to fourth wiring patterns P1 to P4 and a second partial pattern Pp2 as will be described in detail below) are formed therein. Further, the first connection member 3cU and the second connection member 3cD are connected to various wiring groups by each of connectors CN1 to CN3. The first connection member 3cU connects the first contacts T1, T3, T5, T7, . . . , and T(N−1) and the first wirings C1, C3, C5, C7, . . . , and C(N−1). Further, the second connection member 3cD connects the second contacts T2, T4, T6, T8, . . . , and TN and the second wirings C2, C4, C6, C8, . . . , and CN.

Specifically, as illustrated in FIG. 6, the first connection member 3cU includes: a plurality of electrodes E1, E3, E5, E7, . . . , and E(N−1) with which the first contacts T1, T3, T5, T7, . . . , and T(N−1) are brought into contact; the first wiring pattern P1 connected to these electrodes E1, E3, E5, E7, . . . , and E(N−1) and connected to the first wirings C1, C3, C5, C7, . . . , and C(N−1); and the second partial pattern Pp2 forming each part of the second wirings C2, C4, C6, C8, . . . , and CN. Further, the first connection member 3cU further includes the fourth wiring pattern P4 extended from the second partial pattern Pp2.

Further, as illustrated in FIG. 6, the second connection member 3cD includes: a plurality of electrodes E2, E4, E6, E8, . . . , and EN with which the second contacts T2, T4, T6, T8, . . . , and TN are brought into contact; the second wiring pattern P2 connected to these electrodes E2, E4, E6, E8, . . . , and EN and connected to the second wirings C2, C4, C6, C8, . . . , and CN; and the third wiring pattern P3 connected to the third wirings Cb1, Cb3, Cb5, Cb1, . . . , and Cb(N−1).

Then, according to the present embodiment, the first wiring pattern P1 and the second partial pattern Pp2, respectively connected to the first contacts T1, T3, T5, . . . , and T(N−1) and second contacts T2, T4, T6, . . . , and TN corresponding to each other, are arranged adjacent to each other in the first connection member 3cU. Since the first wiring pattern P1 and the second partial pattern Pp2 are arranged adjacent to each other in the first connection member 3cU in this manner, it is possible to suppress a decrease in measurement accuracy even when noise is generated on the proximal side of the first connection member 3cU due to an external factor.

Further, according to the present embodiment, the third wiring pattern P3 and the second wiring pattern P2, respectively connected to the first contacts T1, T3, T5, . . . , and T(N−1) and second contacts T2, T4, T6, . . . , and TN corresponding to each other, are arranged adjacent to each other in the second connection member 3cD. Since the third wiring pattern P3 and the second wiring pattern P2 are arranged adjacent to each other in the second connection member 3cD in this manner, it is possible to suppress a decrease in measurement accuracy even when noise is generated in the second connection member 3cD due to an external factor.

Further, according to the present embodiment, the first wiring pattern P1 and the fourth wiring pattern P4, respectively connected to the first contacts T1, T3, T5, ..., and T(N−1) and second contacts T2, T4, T6, ..., and TN corresponding to each other, are arranged adjacent to each other in the first connection member 3cU. Since the first wiring pattern P1 and the fourth wiring pattern P4 are arranged adjacent to each other in the first connection member 3cU in this manner, it is possible to suppress a decrease in measurement accuracy even when noise is generated on the distal side of a point where the first wiring pattern P1 and the second partial pattern Pp2 are divided.

That is, a resistance measuring device according to an example of the present disclosure includes: a first jig that is capable of facing a first surface of an object to be measured; a plurality of first contacts that are provided in the first jig and are capable of being brought into contact with the first surface; a second jig that is capable of facing a second surface of the object to be measured; a plurality of second contacts that are provided in the second jig to correspond to the plurality of first contacts, respectively, and are capable of being brought into contact with the second surface; a resistance measuring unit configured to supply a current between one of the first contacts and one of the second contacts, which correspond to each other, detect a voltage between another first contact adjacent to the one first contact and another second contact adjacent to the one second contact, which correspond to each other, and calculate a resistance value of the object to be measured based on a relationship between a value of the supplied current and a value of the detected voltage; first wirings connecting the resistance measuring unit and the first contacts, for the first contacts, respectively; and second wirings connecting the resistance measuring unit and the second contacts while passing from the resistance measuring unit through a vicinity of the first jig, for the second contacts, respectively, the first wirings and the second wirings, respectively connected to the first contacts and the second contacts corresponding to each other, being arranged adjacent to each other between the resistance measuring unit and the first jig.

According to this configuration, since the first wirings and the second wirings are arranged adjacent to each other, it is possible to suppress a decrease in measurement accuracy even when noise is generated between the resistance measuring unit and the first jig due to an external factor.

Further, it is preferable that the resistance measuring device further include third wirings extended respectively from the first wirings, for the first contacts, respectively, and that the third wirings and the second wirings, respectively connected to the first contacts and the second contacts corresponding to each other, be arranged adjacent to each other between the first jig and the second jig.

According to this configuration, since the third wirings and the second wirings are arranged adjacent to each other, it is possible to suppress a decrease in measurement accuracy even when noise is generated between the first jig and the second jig due to an external factor.

Further, it is preferable that the resistance measuring device further include fourth wirings extended respectively from the second wirings, for the second contacts, respectively, and that the first wirings and the fourth wirings, respectively connected to the first contacts and the second contacts corresponding to each other, be arranged adjacent to each other on a distal side of a point where the first wirings and the second wirings are divided.

According to this configuration, since the first wirings and the fourth wirings are arranged adjacent to each other, it is possible to suppress a decrease in measurement accuracy even when noise is generated due to an external factor at the distal side of the point where the first wirings and the second wirings are divided.

Further, a resistance measuring device according to an example of the present disclosure includes: a first jig that is capable of facing a first surface of an object to be measured; a plurality of first contacts that are provided in the first jig and are capable of being brought into contact with the first surface; a second jig that is capable of facing a second surface of the object to be measured; a plurality of second contacts that are provided in the second jig to correspond to the plurality of first contacts, respectively, and are capable of being brought into contact with the second surface; a resistance measuring unit configured to supply a current between one of the first contacts and one of the second contacts, which correspond to each other, detect a voltage between another first contact adjacent to the one first contact and another second contact adjacent to the one second contact, which correspond to each other, and calculate a resistance value of the object to be measured based on a relationship between a value of the supplied current value and a value of the detected voltage; first wirings connecting the resistance measuring unit and the first contacts, for the first contacts, respectively; second wirings connecting the resistance measuring unit and the second contacts, for the second contacts, respectively, the first wirings and the second wirings, respectively connected to the first contacts and the second contacts corresponding to each other, being arranged adjacent to each other from the resistance measuring unit to a predetermined point before reaching the first jig; third wirings extended respectively from the predetermined point of the first wirings, for the first contacts, respectively, the third wirings and the second wirings, respectively connected to the first contacts and the second contacts corresponding to each other, being arranged adjacent to each other on a distal side of the predetermined point; and fourth wirings extended respectively from the predetermined point of the second wirings, for the second contacts, respectively, the first wirings and the fourth wirings, respectively connected to the first contacts and the second contacts corresponding to each other, being arranged adjacent to each other on a distal side of the predetermined point.

According to this configuration, the first wirings and the second wirings are arranged adjacent to each other up to the predetermined point, and the third wirings and the second wirings are arranged adjacent to each other and the first wirings and the fourth wirings are arranged adjacent to each other on the distal side of the predetermined point. Thus, it is possible to suppress a decrease in measurement accuracy even when the noise is generated in each wiring due to an external factor.

Further, a resistance measuring jig according to an example of the present disclosure includes: a first jig that is capable of facing a first surface of an object to be measured; a plurality of first contacts that are provided in the first jig and are capable of being brought into contact with the first surface; a second jig that is capable of facing a second surface of the object to be measured; a plurality of second contacts that are provided in the second jig to correspond to the plurality of first contacts, respectively, and are capable of being brought into contact with the second surface; first wirings respectively connected to the first contacts; and second wirings respectively connected to the second contacts and passing through a vicinity of the first jig, the first wirings and the second wirings, respectively connected to the first contacts and the second contacts corresponding to each other, being arranged adjacent to each other on a proximal side of the vicinity of the first jig.

According to this configuration, since the first wirings and the second wirings are arranged adjacent to each other, it is possible to suppress a decrease in measurement accuracy even when noise is generated on the proximal side of the vicinity of the first jig due to an external factor.

Further, it is preferable that the resistance measuring jig further include third wirings extended respectively from the first wirings, for the first contacts, respectively, and that the third wirings and the second wirings, respectively connected to the first contacts and the second contacts corresponding to each other, be arranged adjacent to each other between the first jig and the second jig According to this configuration, since the third wirings and the second wirings are arranged adjacent to each other, it is possible to suppress a decrease in measurement accuracy even when noise is generated between the first jig and the second jig due to an external factor.

Further, it is preferable that the resistance measuring jig further include fourth wirings extended respectively from the second wirings, for the second contacts, respectively, and that the first wirings and the fourth wirings, respectively connected to the first contacts and the second contacts corresponding to each other, be arranged adjacent to each other on a distal side of a point where the first wirings and the second wirings are divided.

According to this configuration, since the first wirings and the fourth wirings are arranged adjacent to each other, it is possible to suppress a decrease in measurement accuracy even when noise is generated due to an external factor at the distal side of the point where the first wirings and the second wirings are divided.

Further, a resistance measuring jig according to an example of the present disclosure includes: a first jig that is capable of facing a first surface of an object to be measured; a plurality of first contacts that are provided in the first jig and are capable of being brought into contact with the first surface; a second jig that is capable of facing a second surface of the object to be measured; a plurality of second contacts that are provided in the second jig to correspond to the plurality of first contacts, respectively, and are capable of being brought into contact with the second surface; first wirings respectively connected to the first contacts; and second wirings respectively connected to the second contacts and passing through the first jig, the first wirings and the second wirings, respectively connected to the first contacts and the second contacts corresponding to each other, being arranged adjacent to each other on a proximal side of a vicinity of the first jig, the first jig including a first connection member connecting the plurality of first contacts and the first wirings, the first connection member including: a plurality of electrodes with which the plurality of first contacts are brought into contact; a first wiring pattern connected to the electrode and connected to the first wirings; and a second partial pattern forming a part of the second wirings, the first wiring pattern and the second partial pattern, respectively connected to the first contacts and the second contacts corresponding to each other, being arranged adjacent to each other in the first connection member.

According to this configuration, the first wiring pattern and the second partial pattern are arranged adjacent to each other in the first connection member, and thus, it is possible to suppress a decrease in measurement accuracy even when noise is generated on the proximal side of the first connection member due to an external factor.

Further, it is preferable that the resistance measuring jig further include third wirings extended from the first wirings, for the first contacts, respectively, that the third wirings and the second wirings, respectively connected to the first contacts and the second contacts corresponding to each other, be arranged adjacent to each other between the first jig and the second jig, that the second jig include a second connection member connecting the plurality of second contacts and the second wirings, that the second connection member include: a plurality of electrodes with which the plurality of second contacts are brought into contact; a second wiring pattern connected to the electrode and connected to the second wirings; and a third wiring pattern connected to the third wirings, and that the third wiring pattern and the second wiring pattern, respectively connected to the first contacts and the second contacts corresponding to each other, be arranged adjacent to each other in the second connection member.

According to this configuration, the third wiring pattern and the second wiring pattern are arranged adjacent to each other in the second connection member, and thus, it is possible to suppress a decrease in measurement accuracy even when noise is generated in the second connection member due to an external factor.

Further, it is preferable that the resistance measuring jig further include a fourth wiring pattern extended from the second partial pattern, and that the first wiring pattern and the fourth wiring pattern, respectively connected to the first contacts and the second contacts corresponding to each other, be arranged adjacent to each other on a distal side of a point of the first connection member where the first wiring pattern and the second partial pattern are divided.

According to this configuration, the first wiring pattern and the fourth wiring pattern are arranged adjacent to each other in the first connection member, and thus, it is possible to suppress a decrease in measurement accuracy even when noise is generated on the distal side of a point where the first wiring pattern and the second partial pattern are divided in the first connection member.

According to the above resistance measuring device and resistance measuring jig, it is possible to suppress a decrease in measurement accuracy even when noise is generated due to an external factor.

This application is based on Japanese Patent Application No. 2018-56107 filed on Mar. 23, 2018, the content of which is included in the present application. Note that the specific embodiments or examples described in the claim of the description of embodiments are intended to clarify the technical contents of the present disclosure, and the present disclosure should not be narrowly interpreted as being limited only to such specific examples.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A resistance measuring device comprising:
a first jig that is capable of facing a first surface of an object to be measured;

a plurality of first contacts that are provided in the first jig and are capable of being brought into contact with the first surface;
a second jig that is capable of facing a second surface of the object to be measured;
a plurality of second contacts that are provided in the second jig to correspond to the plurality of first contacts, respectively, and are capable of being brought into contact with the second surface;
a resistance measuring unit configured to supply a current between a first one of the first contacts and a first one of the second contacts, which correspond to each other, to detect a voltage between a second one of the first contacts, which is adjacent to the first one of the first contacts, and a second one of the second contacts, which is adjacent to the first one of the second contacts, which correspond to each other, and to calculate a resistance value of the object to be measured based on a relationship between a value of the supplied current value and a value of the detected voltage;
first wirings connecting the resistance measuring unit and the first contacts, for the first contacts, respectively;
second wirings connecting the resistance measuring unit and the second contacts, for the second contacts, respectively,
the first wirings and the second wirings, respectively connected to the first contacts and the second contacts corresponding to each other, being arranged adjacent to each other from the resistance measuring unit to a predetermined branching point before reaching the first jig;
third wirings extended respectively from the predetermined branching point of the first wiring, for the first contacts, respectively,
the third wirings and the second wirings, respectively connected to the first contacts and the second contacts corresponding to each other, being arranged adjacent to each other on a distal side of the predetermined branching point; and
fourth wirings extended respectively from the predetermined branching point of the second wiring, for the second contacts, respectively,
the first wirings and the fourth wirings, respectively connected to the first contacts and the second contacts corresponding to each other, being arranged adjacent to each other on a distal side of the predetermined branching point.

2. A resistance measuring jig comprising:
a first jig that is capable of facing a first surface of an object to be measured;
a plurality of first contacts that are provided in the first jig and are capable of being brought into contact with the first surface;
a second jig that is capable of facing a second surface of the object to be measured;
a plurality of second contacts that are provided in the second jig to correspond to the plurality of first contacts, respectively, and are capable of being brought into contact with the second surface;
first wirings respectively connected to the first contacts; and
second wirings respectively connected to the second contacts and passing through a vicinity of the first jig,
third wirings extended respectively from the first wirings, for the first contacts, respectively,
wherein the first wirings and the second wirings, respectively connected to the first contacts and the second contacts corresponding to each other, are arranged adjacent to each other on a proximal side of the vicinity of the first jig, and
wherein the third wirings and the second wirings, respectively connected to the first contacts and the second contacts corresponding to each other, are arranged adjacent to each other between the first jig and the second jig.

3. The resistance measuring jig according to claim 2, further comprising
fourth wirings extended respectively from the second wirings, for the second contacts, respectively,
wherein the first wirings and the fourth wirings, respectively connected to the first contacts and the second contacts corresponding to each other, are arranged adjacent to each other on a distal side of a portion where the first wirings and the second wirings are divided.

4. The resistance measuring jig according to claim 2, further comprising
fourth wirings extended respectively from the second wirings, for the second contacts, respectively, wherein the first wirings and the fourth wirings, respectively connected to the first contacts and the second contacts corresponding to each other, are arranged adjacent to each other on a distal side of a portion where the first wirings and the second wirings are divided.

5. A resistance measuring device comprising:
the resistance measuring jig according to claim 2;
a resistance measuring unit configured to supply a current between a first one of the first contacts and a first one of the second contacts, which correspond to each other, to detect a voltage between a second one of the first contacts which is adjacent to the first one of the first contacts, and a second one of the second contacts, which is adjacent to the first one of the second contacts, which correspond to each other, and to calculate a resistance value of the object to be measured based on a relationship between a value of the supplied current and a value of the detected voltage;
the first wirings connect the resistance measuring unit and the first contacts, for the first contacts, respectively;
the second wirings connect the resistance measuring unit and the second contacts, for the second contacts, respectively.

6. The resistance measuring device according to claim 5, further comprising
fourth wirings extended respectively from the second wirings, for the second contacts, respectively,
wherein the first wirings and the fourth wirings, respectively connected to the first contacts and the second contacts corresponding to each other, are arranged adjacent to each other on a distal side of a portion where the first wirings and the second wirings are divided.

7. A resistance measuring jig comprising:
a first jig that is capable of facing a first surface of an object to be measured;
a plurality of first contacts that are provided in the first jig and are capable of being brought into contact with the first surface;
a second jig that is capable of facing a second surface of the object to be measured;
a plurality of second contacts that are provided in the second jig to correspond to the plurality of first contacts, respectively, and are capable of being brought into contact with the second surface;

first wirings respectively connected to the first contacts; and second wirings respectively connected to the second contacts and passing through the first jig, wherein the first wirings and the second wirings, respectively connected to the first contacts and the second contacts corresponding to each other, are arranged adjacent to each other on a proximal side of a vicinity of the first jig, the first jig includes a first connection member connecting the plurality of first contacts and the first wirings, the first connection member includes: a plurality of electrodes with which the plurality of first contacts are brought into contact; a first wiring pattern connected to the electrodes and connected to the first wirings; and a second partial pattern forming a part of the second wirings, and the first wiring pattern and the second partial pattern, respectively connected to the first contacts and the second contacts corresponding to each other, are arranged adjacent to each other in the first connection member.

8. The resistance measuring jig according to claim 7, further comprising third wirings extended respectively from the first wirings, for the first contacts, respectively, wherein the third wirings and the second wirings, respectively connected to the first contacts and the second contacts corresponding to each other, are arranged adjacent to each other between the first jig and the second jig, the second jig includes a second connection member connecting the plurality of second contacts and the second wirings, the second connection member includes: a plurality of electrodes with which the plurality of second contacts are brought into contact; a second wiring pattern connected to the electrodes and connected to the second wirings; and a third wiring pattern connected to the third wirings, and the third wiring pattern and the second wiring pattern, respectively connected to the first contacts and the second contacts corresponding to each other, are arranged adjacent to each other in the second connection member.

9. The resistance measuring jig according to claim 8, wherein the first connection member further comprises a fourth wiring pattern extended from the second partial pattern, and the first wiring pattern and the fourth wiring pattern, respectively connected to the first contacts and the second contacts corresponding to each other, are arranged adjacent to each other on a distal side of a point of the first connection member where the first wiring pattern and the second partial pattern are divided.

10. The resistance measuring jig according to claim 7, wherein the first connection member further comprises a fourth wiring pattern extended from the second partial pattern, and the first wiring pattern and the fourth wiring pattern, respectively connected to the first contacts and the second contacts corresponding to each other, are arranged adjacent to each other on a distal side of a point of the first connection member where the first wiring pattern and the second partial pattern are divided.

* * * * *